United States Patent
Takeuchi et al.

(10) Patent No.: US 6,937,034 B1
(45) Date of Patent: Aug. 30, 2005

(54) ABSOLUTE VALUE CALCULATING ELEMENT FOR CONVERTING AC SIGNALS INTO DC SIGNALS

(75) Inventors: Yukihisa Takeuchi, Nishikamo-Gun (JP); Iwao Ohwada, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 368 days.

(21) Appl. No.: 09/688,039

(22) Filed: Oct. 11, 2000

(30) Foreign Application Priority Data

Nov. 12, 1999 (JP) ................................. 11-323206

(51) Int. Cl.[7] ......................................... G01R 29/22
(52) U.S. Cl. .................... 324/727; 324/158.1
(58) Field of Search .................. 324/437, 244, 324/727; 428/461; 310/323, 328, 3.4, 316.61, 310/318–319, 323.06, 311, 367; 327/100–103, 327/354

(56) References Cited

U.S. PATENT DOCUMENTS

| | | | |
|---|---|---|---|
| 3,707,636 A | * | 12/1972 | Inoue ......................... 310/318 |
| 3,796,897 A | * | 3/1974 | Sakurai ....................... 310/319 |
| 4,912,351 A | * | 3/1990 | Takata et al. ........... 310/323.16 |
| 4,912,355 A | * | 3/1990 | Neal et al. .................... 73/774 |
| 5,103,174 A | * | 4/1992 | Wandass et al. ............ 324/244 |
| 5,233,260 A | * | 8/1993 | Harada et al. .............. 310/328 |
| 5,594,240 A | * | 1/1997 | Weiss ......................... 324/457 |
| 5,869,189 A | * | 2/1999 | Hagood et al. ............. 428/461 |
| 5,889,353 A | * | 3/1999 | Takeuchi et al. ............ 310/328 |
| 5,910,700 A | * | 6/1999 | Crotzer ....................... 310/338 |
| 6,107,726 A | * | 8/2000 | Near et al. .................. 310/328 |

\* cited by examiner

*Primary Examiner*—Vinh P. Nguyen
(74) *Attorney, Agent, or Firm*—Burr & Brown

(57) ABSTRACT

A sensor element formed of PZT is overlapped onto an actuator formed of electrostrictive elements, and both members are pinched between a rigid body that is not deformed. By impressing an alternating-current signal to the actuator, the sensor element is deformed in accordance with the amount of deformation thereof to use the thus generated electromotive force of the sensor element as a signal for the absolute value calculation.

5 Claims, 2 Drawing Sheets

ABSOLUTE VALUE CALCULATING ELEMENT FOR CONVERTING AC SIGNALS INTO DC SIGNALS

FIELD OF THE INVENTION

The present invention relates to an absolute value calculating element for converting alternating-current signals into direct-current signals.

BACKGROUND OF THE INVENTION

Conventionally known absolute value calculating means for performing an absolute value calculation of alternating voltage (AC) signals and converting the same into direct-current voltage (DC) signals include full-wave rectification circuits arranged by assembling diodes, or circuits in which such circuits are combined with transformers.

However, it is sufficient to provide a single diode in the case of performing half-wave rectification in such a circuit employing diodes, when remaining half-waves will not be output but ignored. On the other hand, a plurality of elements to be imposed will be required in the case of forming a circuit in which full-wave rectification is performed so that forming the circuit will be troublesome. Moreover, while both of these circuits enable conversion in an effective manner since electric signals are directly converted into electric signals, forward voltage drops due to the diodes will not be zero, so that it may cause errors in the case of performing an absolute value calculation of minute signals using diodes.

The present invention has thus been made in view of these problems, and it is an object thereof to provide an absolute value calculating element for converting alternating-current signals into direct-current signals having a small amount of imposed elements and without causing a specific voltage drop.

SUMMARY OF THE INVENTION

For solving the above object, the present invention is provided with electrostrictive elements and a detecting means for detecting an amount of deformation thereof, wherein an alternating-current signal is calculated into an absolute value and output by impressing the alternating-current signal to the electrostrictive elements to deform the same and by converting a distortion of the electrostrictive elements into an electric signal using the detecting means.

According to another embodiment of the present invention, a piezoelectric/electrostrictive element is provided that is deformed in proportion to the amount of deformation of the electrostrictive elements, wherein an alternating-current signal is calculated into an absolute value and output by impressing the alternating-current signal to the electrostrictive element to deform the same and by outputting the electromotive force generated by the deformation of the piezoelectric/electrostrictive element.

The electrostrictive elements and the piezoelectric/electrostrictive element are overlapped and pinched between a rigid body that is not deformed. Further, one end of the electrostrictive elements is fixed in a deforming direction thereof, while the other end of the electrostrictive element is fixedly attached to one surface of an elastic plate body. One end of the elastic plate body is fixed and the other end is formed as a free end, and a plate-like piezoelectric/electrostrictive element is fixedly attached to the other surface of the elastic plate body.

Further still, the electrostrictive elements and the piezoelectric/electrostrictive element are formed to assume a plate-like shape, wherein the electrostrictive elements are fixedly attached to one surface of the plate-like elastic plate body, while the piezoelectric/electrostrictive element is fixedly attached to the opposing surface of the plate-like elastic body.

DETAILED DESCRIPTION OF THE INVENTION

Figure 1:
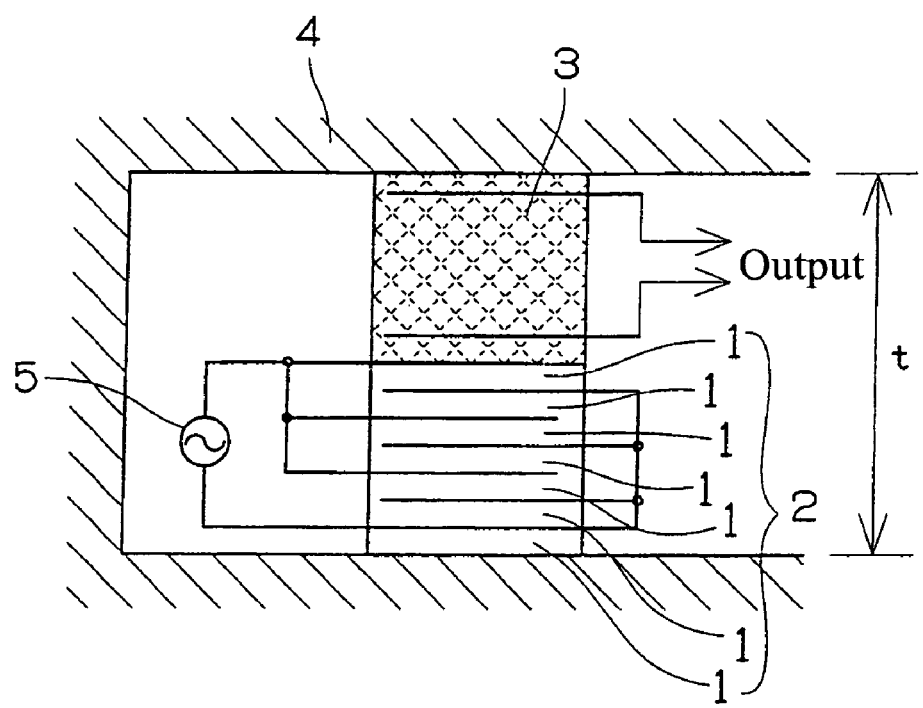
FIG. 1 is an explanatory view showing one example of an absolute value calculating element according to an embodiment of the present invention.

Embodiments for materializing the present invention will now be explained with reference to the drawings. FIG. 1 is a schematic view showing one example of an absolute value calculating element according to the present invention, wherein an actuator 2 of substantially columnar shape is formed by overlapping a plurality of disk-like shaped electrostrictive elements 1, and a sensor element 3 of substantially identical shape is provided in an overlapping manner to be succeeding to the actuator 2. Both the actuator 2 and the sensor element 3 are pinched between a rugged rigid body 4 that will not be deformed, and the sensor element 3 is provided to be deformable in accordance with deformations in the actuator 2, such that a dimension "t" in an entire height direction, as illustrated in FIG. 1, becomes constant. An alternating signal source 5 is connected to each of the electrostrictive elements 1 of the actuator 2 so that the electromotive force of the sensor element 3 will be extracted.

It should be noted that the sensor element 3 is preferably a piezoelectric element, e.g. a PZT material. It is alternatively possible to employ, instead of such an element utilizing piezoelectric effects, elements exhibiting piezoresistant effects such as a semiconductor gauge, an element utilizing magnetoresistant effects, a differential transformer, an eddy-current sensor, an element for detecting variations in capacities, or an electrostrictive element. Moreover, the actuator 2 may be a conventionally known MLP, in which a plurality of electrostrictive elements are formed to assume a laminated structure. However, in the case a piezoelectric element (formed of ceramics, such as PZT) is to be used as the sensor element, the actuator may be similarly formed of ceramics, such that both members may be integrally formed in a simple and effective manner.

Figure 2:
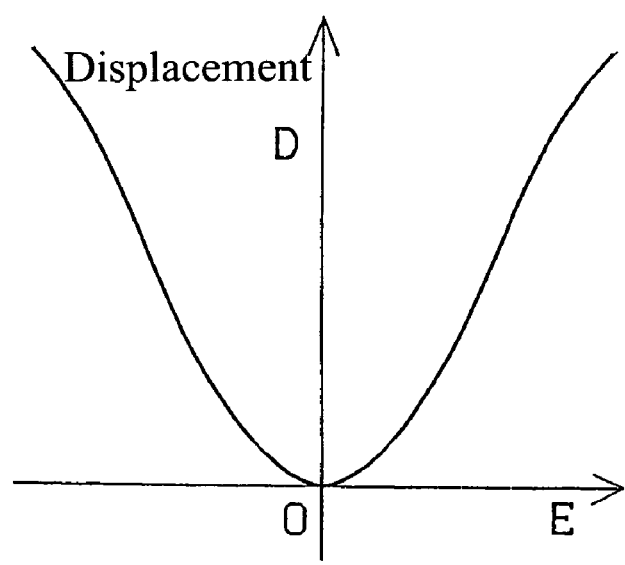
FIG. 2 is a view showing the characteristics of impressed voltage-deformation of the electrostrictive elements.

Since the electrostrictive elements 1 are deformed in an identical direction upon receipt of positive/negative voltage signals as illustrated in the characteristics of the impressed voltage-deformation of FIG. 2, the actuator 2 will be accordingly deformed in an identical direction upon impressing positive/negative voltage signals to perform the absolute value calculating actions. Thus, an electric signal such as electromotive force, that is expressed as an absolute value will be generated from the sensor element deformed in accordance with the actuator 2.

Since the absolute value calculation of alternating-current signals may be performed by an integrally formed element, high-integration is enabled without the necessity of arranging a different circuit, and the output of the absolute values of favorable characteristics may be obtained with small input signals since electrostrictive elements do not exhibit threshold characteristics, such as forward voltage drop as is the case with diodes.

Since the arrangement does not perform direct conversion of electric signals to electric signals, inputs and outputs may be electrically isolated from each other so that no conducting condition will be generated between inputs and outputs, even in the case of degradation or damage of the elements. It is further possible to provide a mechanism that does not respond to high frequencies, since mechanical displacements are interposed, and it is accordingly possible to incorporate functions of a low pass filter.

Figure 3:
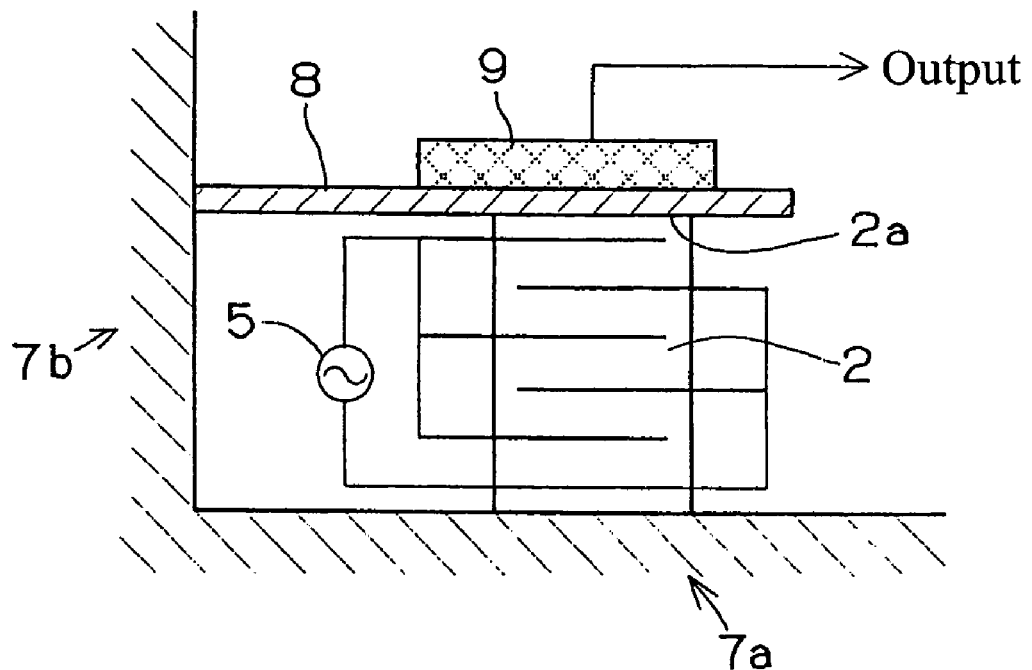
FIG. 3 is an explanatory view showing another embodiment of the present invention.

FIG. 3 illustrates another embodiment, in which a fixed bottom surface 7a and a wall surface 7b are provided onto which bottom surface 7a the actuator 2 is fixed. The upper surface 2a is fixedly attached to a rear surface of an elastic plate-like body 8, with one end thereof being fixed to the wall surface, and a plate-like sensor element 9 is fixedly attached to an upper surface of the plate-like body 8. The sensor element 9 may be preferably comprised of a piezoelectric unimorph.

Also with this arrangement, deformation of the actuator 2 causes deflection of the plate-like body 8 so that the sensor element 9 is accordingly deformed or distorted through the deflection to thus generate an electromotive force. It is thus possible to perform the absolute value calculation of the alternating voltage signals and to output the absolute value signals. It should be noted that the plate-like body 8 may be a metallic plate or formed of resin or ceramics.

Figure 4:
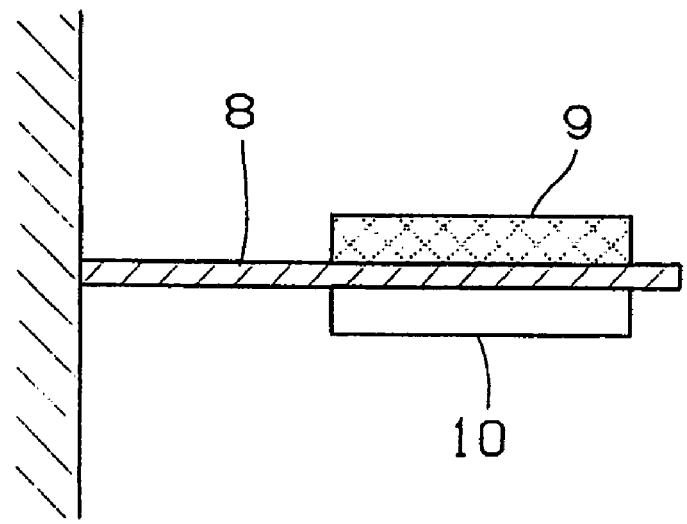
FIG. 4 is an explanatory view showing still another embodiment of the present invention.

In the case when the elastic plate-like body is interposed, an actuator 10 may be similarly formed to assume a plate-like shape in addition to the sensor element 9, as illustrated in FIG. 4. In this manner, the entire absolute value calculating element may be manufactured in a simpler manner.

To obtain a sufficient amount of deformation of the actuator 2, alternating-current signals to be input are amplified using an operational amplifier or the like, such that output signals expressed as absolute values and having high S/N ratios may be obtained.

As explained above in detail, the present invention enables the performance of an absolute value calculation of alternating-current signals by using an integrally formed element and enables high-integration without the necessity of providing a peripheral circuit. Though diodes would cause voltage drop though it may be a forward one, a piezoelectric/electrostrictive element will not exhibit such threshold-like characteristics so that it is possible to perform the absolute value calculation in a favorable manner and with small signals. Since no direction conversion of electric signals into electric signals is performed, the input and output may be electrically isolated.

What is claimed is:

1. An absolute value calculating element comprising: electrostrictive elements; and
detecting means for detecting an amount of deformation of said electrostrictive elements;
wherein an alternating-current signal is calculated into an absolute value and output by impressing the alternating-current signal to said electrostrictive elements to deform said electrostrictive elements and by converting a distortion of said electrostrictive elements into a direct-current electric signal using said detecting means.

2. The absolute value calculating element of claim 1, wherein said detecting means comprises a piezoelectric/electrostrictive element that is deformed in proportion to the amount of said deformation of said electrostrictive elements; and
wherein the alternating-current signal is calculated into an absolute value and output by impressing the alternating-current signal to said electrostrictive elements to deform said electrostrictive elements and by outputting an electromotive force generated by said deformation of said piezoelectric/electrostrictive element.

3. The absolute value calculating element of claim 2, wherein said electrostrictive elements and said piezoelectric/electrostrictive element are overlapped and pinched between a rigid body that is not deformed.

4. The absolute value calculating element of claim 2, wherein one end of each said electrostrictive element is fixed in a deforming direction thereof while the other end of each said electrostrictive element is fixedly attached to one surface of an elastic plate body, said elastic plate body having one fixed end and another free end; and
wherein said piezoelectric/electrostrictive element is plate-shaped and fixedly attached to an opposed surface of said elastic plate body.

5. The absolute value calculating element of claim 4, wherein said electrostrictive elements are plate shaped.

* * * * *